United States Patent
Kim et al.

(10) Patent No.: US 8,972,775 B2
(45) Date of Patent: Mar. 3, 2015

(54) MEMORY DEVICE AND METHOD OF MANAGING MEMORY DATA ERROR INCLUDING DETERMINING VERIFICATION VOLTAGES AND CHANGING THRESHOLD VOLTAGES BASED ON A CORRECTED ERROR BIT

(75) Inventors: Yong June Kim, Seoul (KR); Jae Hong Kim, Seoul (KR); Jun Jin Kong, Yongin-si (KR); Kyoung Lae Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1521 days.

(21) Appl. No.: 12/453,163

(22) Filed: Apr. 30, 2009

(65) Prior Publication Data
US 2009/0287975 A1 Nov. 19, 2009

(30) Foreign Application Priority Data
May 15, 2008 (KR) .................. 10-2008-0044964

(51) Int. Cl.
| | |
|---|---|
| G06F 11/07 | (2006.01) |
| G11C 16/10 | (2006.01) |
| G06F 11/10 | (2006.01) |

(Continued)

(52) U.S. Cl.
CPC ............ *G11C 16/10* (2013.01); *G06F 11/1072* (2013.01); *G11C 11/5628* (2013.01); *G11C 11/5642* (2013.01); *G11C 16/3454* (2013.01);

(Continued)

(58) Field of Classification Search
USPC ............ 714/6.1, 6.11, 718, 728, 721, 49, 54; 365/185.22, 200, 201, 185.02, 185.03, 365/185.09, 185.24
See application file for complete search history.

(56) References Cited

U.S. PATENT DOCUMENTS

| | | |
|---|---|---|
| 5,754,566 A | 5/1998 | Christopherson et al. |
| 5,859,858 A | 1/1999 | Leeman |

(Continued)

FOREIGN PATENT DOCUMENTS

| | | |
|---|---|---|
| EP | 1 418 592 A1 | 5/2004 |
| JP | 08077785 | 3/1996 |

(Continued)

OTHER PUBLICATIONS

International Search Report issued on Apr. 27, 2010 for the corresponding PCT Application No. PCT/KR2009/002530.

(Continued)

*Primary Examiner* — Joseph Schell
(74) *Attorney, Agent, or Firm* — Harness, Dickey & Pierce

(57) ABSTRACT

Memory devices and/or methods of managing memory data errors are provided. A memory device detects and corrects an error bit of data read from a plurality of memory cells, and identifies a memory cell storing the detected error bit. The memory device assigns a verification voltage to each of the plurality of first memory cells, the assigned verification voltage corresponding to the corrected bit for the identified memory cell, the assigned verification voltage corresponding to the read data for the remaining memory cells. The memory device readjusts the data stored in the plurality of memory cells using the assigned verification voltage. Through this, it is possible to increase a retention period of the data of the memory device.

22 Claims, 11 Drawing Sheets

(51) Int. Cl.
*G11C 11/56* (2006.01)
*G11C 16/34* (2006.01)
*G11C 29/00* (2006.01)

(52) U.S. Cl.
CPC ........ *G11C 29/00* (2013.01); *G11C 2211/5621* (2013.01); *G11C 2211/5634* (2013.01)
USPC .............. 714/6.11; 714/49; 714/54; 714/721; 365/185.03; 365/185.09

(56) References Cited

U.S. PATENT DOCUMENTS

| | | | |
|---|---|---|---|
| 5,936,890 A | 8/1999 | Yeon | |
| 6,603,680 B2 * | 8/2003 | Kanamitsu et al. | 365/185.03 |
| 6,744,670 B2 * | 6/2004 | Tamada et al. | 365/185.19 |
| 7,355,892 B2 * | 4/2008 | Hemink | 365/185.22 |
| 7,468,924 B2 * | 12/2008 | Kwon | 365/195 |
| 7,551,478 B2 * | 6/2009 | Kanno | 365/185.09 |
| 7,633,797 B2 * | 12/2009 | Chen et al. | 365/185.03 |
| 7,663,934 B2 * | 2/2010 | Ha | 365/185.33 |
| 7,673,220 B2 * | 3/2010 | Kim et al. | 714/773 |
| 7,715,239 B2 * | 5/2010 | Aritome | 365/185.22 |
| 7,814,401 B2 * | 10/2010 | Alrod et al. | 714/794 |
| 7,821,840 B2 * | 10/2010 | Hadas et al. | 365/185.28 |
| 7,904,788 B2 * | 3/2011 | Brandman et al. | 714/760 |
| 8,000,141 B1 * | 8/2011 | Shalvi et al. | 365/185.09 |
| 8,127,202 B2 * | 2/2012 | Cornwell et al. | 714/764 |
| 8,499,227 B2 * | 7/2013 | Liikanen et al. | 714/786 |
| 2003/0007388 A1 | 1/2003 | Kawai et al. | |
| 2004/0237010 A1 * | 11/2004 | Auclair et al. | 714/721 |
| 2007/0091677 A1 * | 4/2007 | Lasser et al. | 365/185.09 |
| 2007/0277060 A1 * | 11/2007 | Cornwell et al. | 714/54 |
| 2008/0198650 A1 * | 8/2008 | Shalvi et al. | 365/185.02 |
| 2008/0239811 A1 * | 10/2008 | Tanaka | 365/185.11 |
| 2008/0320346 A1 * | 12/2008 | Lin | 714/721 |

FOREIGN PATENT DOCUMENTS

| | | |
|---|---|---|
| JP | 2000149592 A | 5/2000 |
| JP | 2002-133892 | 5/2002 |
| JP | 2003-067260 | 3/2003 |
| JP | 2003-100095 | 4/2003 |
| JP | 2005527062 A | 9/2005 |
| JP | 2006527901 A | 12/2006 |
| JP | 2007-066386 | 3/2007 |
| JP | 2008059679 | 3/2008 |
| KR | 10-1999-0088497 | 12/1999 |
| KR | 10-0266748 | 6/2000 |
| KR | 100799018 B1 | 1/2008 |

OTHER PUBLICATIONS

Japanese Office Action dated Jun. 11, 2013 for corresponding Japanese Application No. 2011-509408.

Office Action for corresponding Japanese Application No. 2011-509408 dated Mar. 25, 2014.

Office Action for corresponding Korean Application No. 10-2008-0044964 dated Aug. 25, 2014.

* cited by examiner ered to as a single-bit cell (SBC) memory. A process of storing the data in a memory cell (a single-level cell) of the SLC memory may be referred to as a program process, and may change a threshold voltage of the memory cell. For example, when data of a logic value of "1" is stored in the single-level cell, the single-level cell may have a threshold voltage of 1.0 V, and when data of a logic value of "0" is stored in the single-level cell, the single-level cell may have a threshold voltage of 3.0 V.

MEMORY DEVICE AND METHOD OF MANAGING MEMORY DATA ERROR INCLUDING DETERMINING VERIFICATION VOLTAGES AND CHANGING THRESHOLD VOLTAGES BASED ON A CORRECTED ERROR BIT

PRIORITY STATEMENT

This application claims priority under 35 U.S.C. §19 to Korean Patent Application No. 10-2008-0044964, filed on May 15, 2008, in the Korean Intellectual Property Office (KIPO), the entire contents of which are incorporated herein by reference.

BACKGROUND

1. Field

Example embodiments relate to methods that may manage errors of data stored in memory devices.

2. Description of Related Art

A single-level cell (SLC) memory device may store one bit of data in a single memory cell. The SLC memory may be referred to as a single-bit cell (SBC) memory. A process of storing the data in a memory cell (a single-level cell) of the SLC memory may be referred to as a program process, and may change a threshold voltage of the memory cell. For example, when data of a logic value of "1" is stored in the single-level cell, the single-level cell may have a threshold voltage of 1.0 V, and when data of a logic value of "0" is stored in the single-level cell, the single-level cell may have a threshold voltage of 3.0 V.

The threshold voltage generated in each single-level cell where the same data is programmed may have a distribution within a predetermined range due to a minute electrical characteristic difference between single-level cells. For example, when a voltage read from the memory cell is higher than or equal to 0.5 V and is lower than 1.5 V, it may be determined that the data stored in the memory cell has a logic value of "1". When the voltage read from the memory cell is higher than or equal to 2.5 V and is lower than 3.5 V, it may be determined that the data stored in the memory cell has a logic value of "0". The data stored in the memory cell may be classified depending on the difference between currents/voltages of the memory cell during the reading operations.

Meanwhile, a multi-level cell (MLC) memory device that can store data of two or more bits in a single memory cell has been proposed in response to a need for higher integration of memory. The MLC memory device may also be referred to as a multi-bit cell (MBC) memory. However, as the number of bits programmed in the single memory cell increases, reliability may deteriorate and a read-failure rate may increase. To program 'm' bits in the single memory cell, any one of $2^m$ threshold voltages may need to be generated in the memory cell. Threshold voltages of memory cells where the same data is programmed may generate a distribution within a range due to the minute electrical characteristic difference between the memory cells. A threshold voltage distribution may correspond to each of $2^m$ data values generated by 'm' bits.

However, since a voltage window for a memory device may be limited, a distance between $2^m$ distributions of threshold voltages between adjacent bits may decrease as 'm' increases, and the distributions may be overlapped as the distance between the distributions decreases. When the distributions are overlapped, the read-failure rate may increase.

As the MLC memory device has been widely and recently used, error control codes or error control coding or error correction codes (ECC) that detect an error occurring when storing and reading the data and correct the detected error have been actively used.

SUMMARY

Example embodiments may provide apparatuses and/or methods that may detect and correct an error to readjust data stored in a multi-bit cell, thereby increasing a retention time of the data.

Example embodiments also may provide apparatuses and/or methods that may manage memory devices to enable an error rate of data to be lower than or equal to a reference value.

According to example embodiments, a memory device may include: a memory cell array including a plurality of memory cells; a reading unit configured to read data from the plurality of memory cells; an error correction unit configured to detect an error bit of the read data, to identify a memory cell storing the detected error bit from among the plurality of memory cells, and to correct the detected error bit; a control unit configured to assign a verification voltage to each of the plurality of first memory cells, the assigned verification voltage corresponding to the corrected bit for the identified memory cell, the assigned verification voltage corresponding to the read data for the remaining memory cells other than the identified memory cell from among the plurality of first memory cells; and a programming unit configured to readjust the data stored in the plurality of memory cells using the assigned verification voltage.

According to example embodiments, a method of managing a memory data error may include: reading data from a plurality of memory cells; detecting an error bit of the read data; identifying a memory cell storing the detected error bit from among the plurality of memory cells; correcting the detected error bit; assigning a verification voltage to each of the plurality of first memory cells, the assigned verification voltage corresponding to the corrected bit for the identified memory cell, the assigned verification voltage corresponding to the read data for remaining memory cells other than the identified memory cell from among the plurality of first memory cells; and readjusting the data stored in the plurality of memory cells using the assigned verification voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
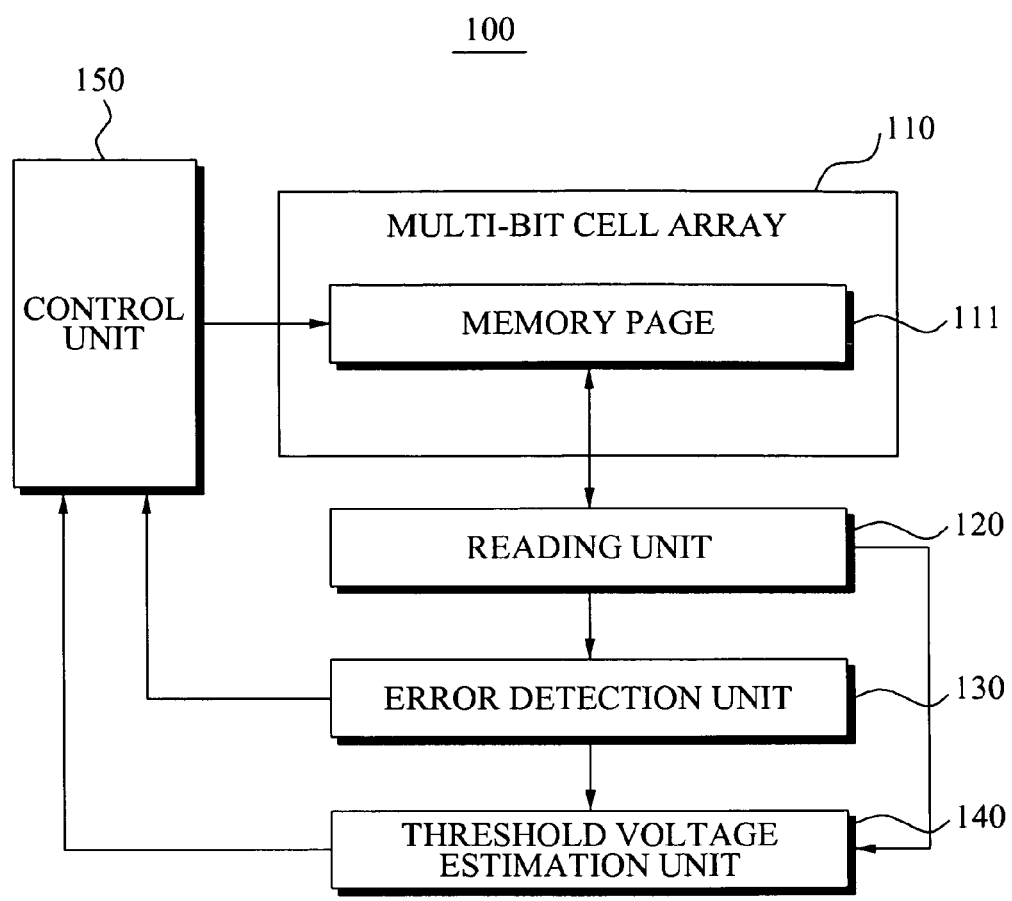
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a memory device 100 according to example embodiments.

Referring to FIG. 1, the memory device 100 may include a multi-bit cell array 110, a reading unit 120, an error detection unit 130, a threshold voltage estimation unit 140, and a control unit 150.

The multi-bit cell array 110 may include a plurality of multi-bit cells. A process of storing data in a multi-bit cell of a non-volatile memory including a flash memory, an Electrically Erasable Programmable Read Only Memory (EEPROM), and the like may be referred to as a programming process, and may correspond to a process of changing a threshold voltage of the multi-bit cell. A process of programming the data in the multi-bit cell may require a time longer than a process of reading the data from the multi-bit cell.

Since the process of programming the data in the multi-bit cell may require a relatively long time, the memory device 100 may simultaneously program the data in the plurality of multi-bit cells to reduce a programming time of all data being programmed. A set of the simultaneously-programmed multi-bit cells may be referred to as a memory page 111 in the present specification for convenience of description. For example, the memory page 111 may include 1000 multi-bit cells, and the multi-bit cell array 110 may include 1000 memory pages.

A process of programming the data in the multi-bit cell of the non-volatile memory may be performed by a mechanism including Fowler-Nordheim tunneling (F-N tunneling), a hot carrier effect (HCE), and the like. F-N tunneling may change the threshold voltage of the multi-bit cell. A single-bit cell may have a low threshold voltage level or a high threshold voltage level, and may express data of "0" or "1" using two threshold voltage levels.

When the multi-bit cell may have any one of $2^m$ threshold voltage levels, the multi-bit cell may store m bits of data or maximum m-bit data. The m-bit data stored in the multi-bit cell may be ordered from a most significant bit (MSB) to a least significant bit (LSB). A bit layer corresponding to the LSB may be referred to as a first bit layer, and a bit layer corresponding to a subsequent significant bit of the LSB may be referred to as a second bit layer in the present specification for convenience of description. A bit layer corresponding to the MSB may be an m-th bit layer. A set of the data of the first bit layer stored in each of the multi-bit cells of the memory page 111 may correspond to a first data page, and a set of the data of the second bit layer may correspond to a second data page.

Depending on embodiments, the memory page 111 may correspond to a set of multi-bit cells connected with a single word line.

The reading unit 120 may simultaneously read the data from the multi-bit cells of the memory page 111. When the memory page 111 corresponds to the set of the multi-bit cells connected with the single word line, the reading unit 120 may apply a specific voltage to the word line to read the data from the multi-bit cells of the memory page 111. The reading unit 120 may read the first data page and the second data page from the multi-bit cells of the memory page 111.

The error detection unit 130 may detect an error bit of the first data page, and may identify the multi-bit cell storing the detected error bit from among the multi-bit cells of the memory page 111.

The threshold voltage estimation unit 140 may estimate a change of the threshold voltage of the identified multi-bit cell based on the detected error bit and the second data page.

The control unit 150 may readjust the data stored in the identified multi-bit cell based on the estimated change of the threshold voltage.

According to example embodiments, the control unit 150 may adjust the threshold voltage of the identified multi-bit cell based on the estimated change of the threshold voltage. The control unit 150 may apply a specific voltage to a word line and a bit line connected with the identified multi-bit cell. The control unit 150 may change the threshold voltage of the identified multi-bit cell using the mechanism including F-N tunneling and the like to readjust the data stored in the identified multi-bit cell to enable an error of the data stored in the identified multi-bit cell to be corrected.

The multi-bit cell may include a control gate (CG) and a floating gate (FG), and an insulator may be inserted between the CG and the FG. The insulator may be inserted between the FG and a substrate. The process of programming the data in the multi-bit cell may correspond to a process of charging an electron in the FG, and a process of erasing the data of the multi-bit cell may correspond to a process of discharging the electron from the FG.

Under a specific bias condition, a channel may be generated in an area closest to the FG of a substrate area. The channel corresponds to an area in which minority carriers of the substrate area are accumulated, and the memory device 1001 may control the minority carriers to program the data in the multi-bit cell or to erase the data from the multi-bit cell.

When a specific bias is applied to a source, a drain, and the CG of the substrate area, the minority carriers of the channel may move to the FG. When the program process, during which the minority carriers of the channel may move to the FG, and an erase process, during which the minority carriers may be discharged from the FG, are repeated, physical damage may occur in the insulator between the FG and the substrate.

When a carrier is accumulated in the FG and a charge may be generated, the data of the multi-bit cell may be determined from the generated charge. The accumulated carrier may leak over time. Causes affecting an amount of leakage of the carrier may include a Program and Erase Cycle (P/E cycle), physical damage, and the like. When the charge stored in the FG is lost by passing through a leakage path, the error may be included in the data stored in the multi-bit cell.

A process of losing the charge stored in the FG may be referred to as a charge loss mechanism, and generally tends to reduce the threshold voltage of the multi-bit cell.

A mechanism example of increasing the threshold voltage of the multi-bit cell to be higher than a desired level may include FG coupling.

FG coupling denotes a phenomenon that the threshold voltage of the central multi-bit cell is affected by a change amount of the threshold voltage of the peripheral multi-bit cells. The threshold voltage of the central multi-bit cell may be affected by coupling of a parasitic capacitance between FGs of the multi-bit cells.

When the program process increases the threshold voltage, the threshold voltage of the central multi-bit cell may increase to be higher than the desired level due to FG coupling.

The threshold voltage estimation unit 140 may estimate the change of the threshold voltage of the identified multi-bit cell. Causes of the change of the threshold voltage of the identified multi-bit cell may include the above-described charge loss, FG coupling, and the like.

The control unit 150 may apply a first condition voltage to the word line connected with the multi-bit cells of the memory page 111, may apply a second condition voltage to the bit line connected with the identified multi-bit cell, and may apply a third condition voltage to bit lines connected with the remaining multi-bit cells other than the identified multi-bit cell from among the multi-bit cells of the memory page 111.

The first condition voltage may correspond to a voltage level of activating a minority carrier channel of the multi-bit cells, and the second condition voltage may correspond to a program voltage level of changing the threshold voltage of the identified multi-bit cell. The third condition voltage may correspond to a program inhibit voltage condition of enabling the threshold voltage of the remaining multi-bit cells not to be changed.

The control unit 150 may adjust the threshold voltage of the identified multi-bit cell without the process of erasing the multi-bit cells of the memory page 111, and may thereby manage an error level of the data.

The control unit 150 may select any one of a first method of adjusting the threshold voltage of the identified multi-bit cell and a second method of programming the data stored in the identified multi-bit cell in new memory cells. The second method may store the data stored in the identified multi-bit cell and the data stored in the multi-bit cells of the memory page 111 in multi-bit cells of a new memory page.

The control unit 150 may select any one of the first method and the second method based on the estimated change of the threshold voltage. The control unit 150 may select the second method when the estimated change of the threshold voltage is greater than a reference value, and may select the first method when the estimated change of the threshold voltage is less than or equal to the reference value.

When an error level of the data stored in the multi-bit cell is relatively great, the control unit 150 may store the data stored in the memory page 111 in the new memory page to manage the error level.

The control unit 150 may select any one of the first method and the second method based on a number of the detected error bits. The control unit 150 may select the second method when the number of the detected error bits is greater than the reference value, and may select the first method when the number of the detected error bits is less than or equal to the reference value.

When the control unit 150 selects the second method, the control unit 150 may adjust a rate of a message and redundant information (redundancy) to generate program data, and may program the generated program data in the multi-bit cells of the new memory page. The control unit 150 may adjust error control codes or error correction codes (ECC) performance of the newly-programmed program data.

A process of adding ECC to initial information prior to transmitting information to generate transmission information may be referred to as ECC encoding, and a process of separating added information and the initial information from the received transmission information after receiving the transmission information to restore the initial information may be referred to as ECC decoding.

The initial information may be referred to as the message, and the added information may be referred to as the redundant information. Generally, as the rate of the redundant information to the message increases, many errors may be corrected during an ECC decoding process. When the control unit 150 selects the second method, the control unit 150 may adjust error correcting capability before the data is programmed in the new memory page.

The memory device 100 may periodically read the first data page and the second data page from the multi-bit cells of the memory page 111. The memory device 100 may periodically check the error level of the data stored in the memory page 111, and may thereby maintain the error level of the data to be less than or equal to a target.

The memory device 100 may adjust the threshold voltage of the multi-bit cell storing the error bit before the error level of the data stored in the memory page 111 exceeds error correcting capability of an ECC decoder, thereby maintaining the error level of the data to be less than or equal to the error correcting capability.

Depending on ECC decoders, when a number of errors of an input codeword is less than or equal to the error correcting capability, all errors of the input codeword may be corrected. As examples of codes whose error correcting capability is explicitly shown, there are block codes and the like. As examples of the block codes, there are Bose, Ray-Chaudhuri, Hocquenghem (BCH) codes, Reed-Solomon (RS) codes, and the like, and as examples of decoding schemes for the block codes, there are a Meggitt decoding scheme, a Berlekamp-Massey decoding scheme, and a Euclid decoding scheme, and the like.

Depending on embodiments, the control unit 150 may determine whether the data stored in the identified multi-bit cell is readjusted based on a metric of the first data page. When the reading unit 120 performs soft decision of the first data page using a plurality of soft decision levels, a decision result value may be shown as the metric. A soft decision result value may be shown as a location or a distance of each of the multi-bit cells in a metric space generated by the threshold voltage.

Depending on embodiments, the control unit 150 may determine whether the data stored in the identified multi-bit cell is readjusted based on a syndrome of the first data page. The error detection unit 130 may multiply a syndrome detection matrix by the first data page read by the reading unit 120 to calculate the syndrome of the first data page. When the calculated syndrome is different from a zero vector, the first data page may be regarded as including the error bit. The syndrome detection matrix may be calculated from a generator matrix of generating a codeword from the message.

Depending on embodiments, the control unit 150 may determine whether the data stored in the identified multi-bit cell is readjusted based on a bit error rate (BER) of the first data page.

Figure 2:
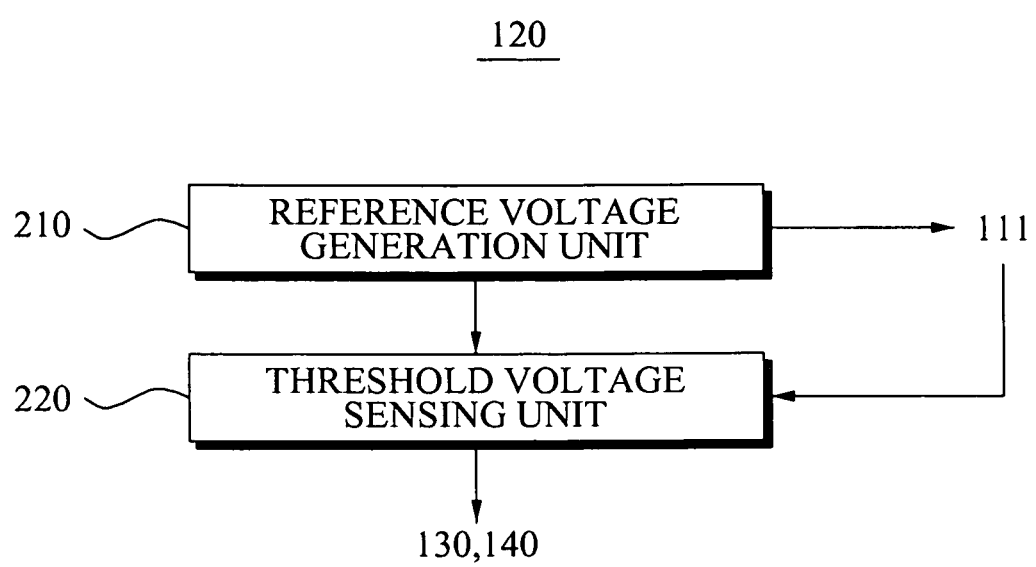
FIG. 2 is a block diagram illustrating a reading unit of FIG. 1.

FIG. 2 is a block diagram illustrating the reading unit 120 of FIG. 1.

Referring to FIG. 2, the reading unit 120 includes a reference voltage generation unit 210 and a threshold voltage sensing unit 220.

The reference voltage generation unit 210 may generate a reference voltage level.

The threshold voltage sensing unit 220 may sense a range of a threshold voltage of each of multi-bit cells of the memory page 111. The reading unit 120 may decide a first data page and a second data page from the sensed range of the threshold voltage.

The reference voltage generation unit 210 may generate a first reference voltage level, and may generate a first word line voltage level corresponding to the first reference voltage level. The reading unit 120 may apply the first word line voltage level to a word line connected with the multi-bit cells of the memory page 111.

A multi-bit cell having the threshold voltage higher than a first word voltage level from among the multi-bit cells of the memory page 111 may be turned on. A current may flow between a drain terminal and a source terminal of the turned-on multi-bit cell.

A multi-bit cell having the threshold voltage lower than the first word voltage level from among the multi-bit cells of the memory page 111 may be turned off. The current may not flow between the drain terminal and the source terminal of the turned-off multi-bit cell.

The threshold voltage sensing unit 220 may sense the current flowing through a bit line of each of the multi-bit cells of the memory page 111 to sense whether the threshold voltage of each of the multi-bit cells of the memory page 111 is higher than the first reference voltage level.

The reference voltage generation unit 210 may generate a second reference voltage level, and may generate a second word line voltage level corresponding to the second reference voltage level. When the second word line voltage level is applied to a word line, the threshold voltage sensing unit 220 may sense whether the threshold voltage of each of the multi-bit cells of the memory page 111 is higher or lower than the second reference voltage level.

When the multi-bit cells store m-bit data, the reading unit 120 may sense the range of the threshold voltage using $2^m-1$ reference voltage levels. When the reading unit 120 performs soft decision of the data stored in the multi-bit cells of the memory page 111, reference voltage levels greater than the $2^m-1$ reference voltage levels may be required.

Figure 3:
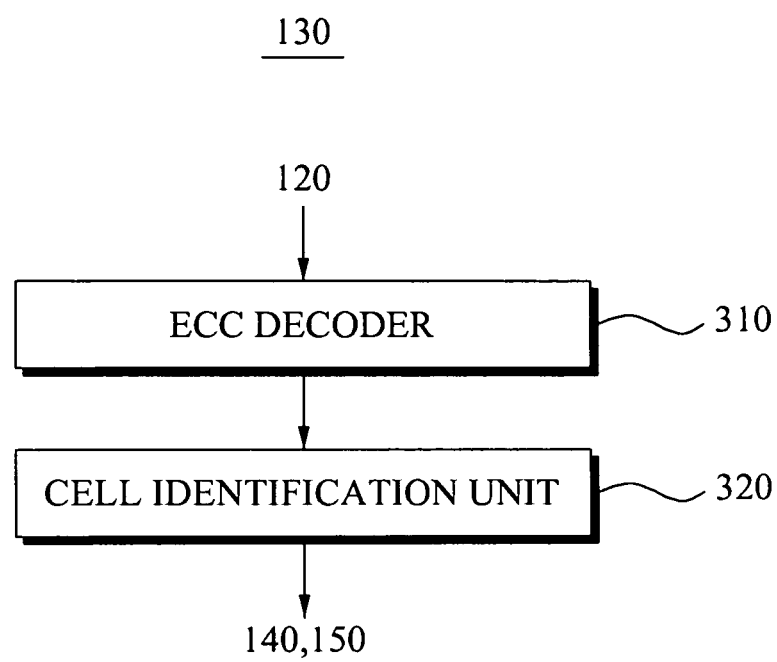
FIG. 3 is a block diagram illustrating an error detection unit of FIG. 1.

FIG. 3 is a block diagram illustrating the error detection unit 130 of FIG. 1.

Referring to FIG. 3, the error detection unit 130 may include an ECC decoder 310 and a cell identification unit 320.

The ECC decoder 310 may decode a first data page to detect an error bit of the first data page.

The cell identification unit 320 may identify a multi-bit cell storing the detected error bit from among multi-bit cells of the memory page 111.

Depending on embodiments of ECC decoding methods, an error bit of a codeword may be detected, and a location of the detected error bit may be identified. The ECC decoder 310 may transmit the identified location of the error bit to the cell identification unit 320. The cell identification unit 320 may identify the multi-bit cell storing the error bit using ECC decoding information.

Figure 4:
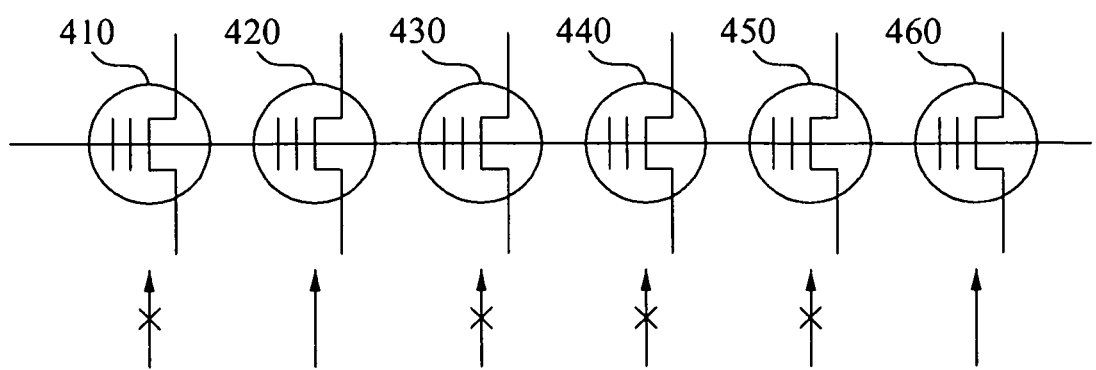
FIG. 4 illustrates a portion of a memory page of FIG. 1.

FIG. 4 illustrates a portion of the memory page 111 of FIG. 1.

Referring to the example illustrated FIG. 4, the memory page 111 may include six multi-bit cells 410 through 460. However, according to example embodiments, memory page 111 may include any number of multi-bit cells.

The six multi-bit cells 410 through 460 may be connected with a single word line.

In the example illustrated in FIG. 4, for convenience of description, the multi-bit cell 420 and the multi-bit cell 460 are assumed as storing an error bit, and remaining multi-bit cells 410, 430, 440, and 450 are assumed as not storing the error bit.

The control unit 150 may apply a first condition voltage to the word line, may apply a second condition voltage to each of bit lines connected with each of the multi-bit cells 420 and 460, and may apply a third condition voltage to each of bit lines connected with the remaining multi-bit cells 410, 430, 440, and 450.

The first condition voltage may correspond to a voltage level of activating a minority carrier channel of the multi-bit cells, and the second condition voltage may correspond to a program voltage level of enabling a threshold voltage of each of the multi-bit cells 420 and 460 to be changed. The third condition voltage may correspond to a program inhibit voltage condition for preventing the threshold voltage of each of the remaining multi-bit cells 410, 430, 440, and 450 from being changed.

The memory device 100 may selectively perform a program operation of only the multi-bit cells 420 and 460 storing the error bit, and may adjust the data stored in the multi-bit cells 420 and 460.

Figure 5:
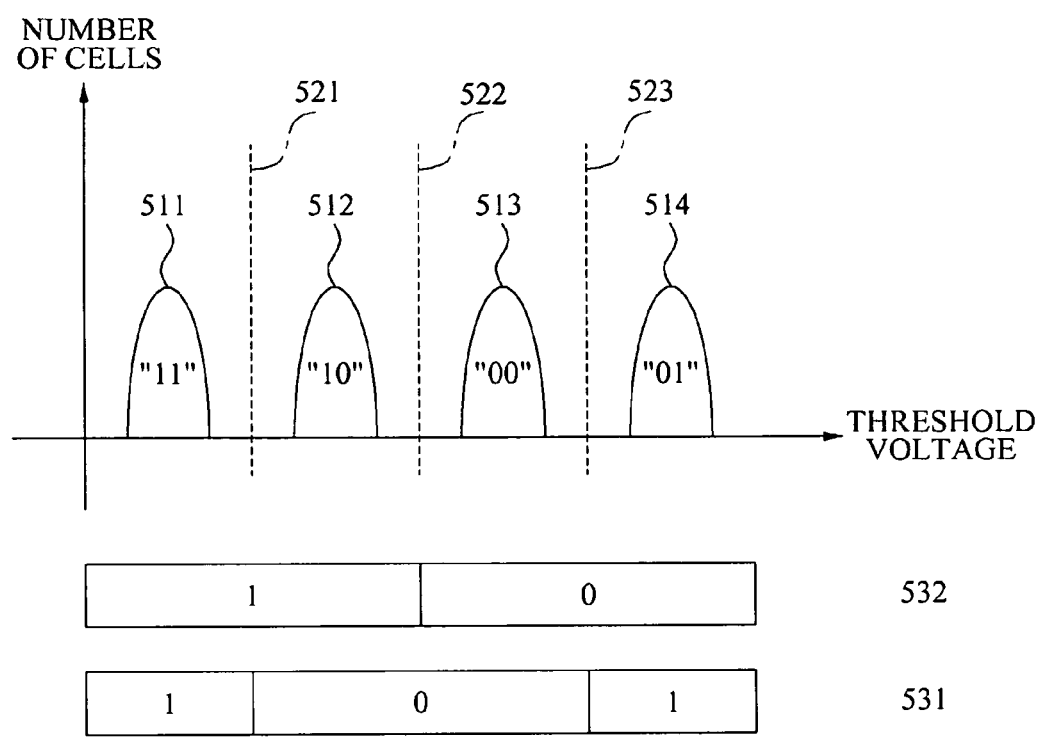
FIG. 5 illustrates an operation of the memory device of FIG. 1.

FIG. 5 illustrates an operation of the memory device 100 of FIG. 1.

Referring to FIG. 5, a relation between a threshold voltage and 2-bit data stored by multi-bit cells of the memory page 111 is illustrated.

A distribution of threshold voltages of the multi-bit cells is shown as a number of the multi-bit cells corresponding to the threshold voltage.

Since electrical differences between each of the multi-bit cells may be minutely different from each other, the threshold voltages of the multi-bit cells may generate the distribution with a predetermined range.

In the example illustrated in FIG. 5, a distribution 511 denotes the multi-bit cells storing data "11"; a distribution 512 denotes the multi-bit cells storing data "10"; a distribution 513 denotes the multi-bit cells storing data "00"; and a distribution 514 denotes the multi-bit cells storing data "01".

The reading unit 120 may decide an MSB stored in the multi-bit cells of the memory page 111 using a second read voltage level 522. The reading unit 120 may decide, as "0", the MSB stored in the multi-bit cells having the threshold voltage higher than or equal to the second read voltage level 522, and may decide, as "1", the MSB stored in the multi-bit cells having the threshold voltage lower than the second read voltage level 522.

The reading unit 120 may decide an LSB stored in the multi-bit cells of the memory page 111 using a first read voltage level 521 and a third read voltage level 523. The reading unit 120 may decide, as "1", the LSB stored in the multi-bit cells having the threshold voltage lower than the first read voltage level 521. The reading unit 120 may decide, as "1", the LSB stored in the multi-bit cells having the threshold voltage higher than or equal to the third read voltage level 523. The reading unit 120 may decide, as "0", the LSB stored in the multi-bit cells having the threshold voltage being higher than or equal to the first read voltage level 521 and being lower than the third read voltage level 523.

A first data page may be generated by the LSB stored in the multi-bit cells of the memory page 111, and a second data page is generated by the MSB stored in the multi-bit cells of the memory page 111.

A mapping relation 531 may denote a relation between a data pattern of the first data page and the distribution of threshold voltages, and a mapping relation 532 may denote a relation between a data pattern of the second data page and the distribution of threshold voltages.

The error detection unit 130 may perform ECC decoding of the first data page, and may detect an error of the first data page. The error detection unit 130 may identify the multi-bit cell storing the detected error using an ECC decoding result.

The threshold voltage estimation unit 140 may extract a change of the data stored in the identified multi-bit cell based on the detected error bit and the second data page. The threshold voltage estimation unit 140 may estimate the change of the threshold voltage of the identified multi-bit cell based on the MSB stored in the identified multi-bit cell and the detected error bit (the error detected with respect to the LSB). The threshold voltage estimation unit 140 may estimate the change of the threshold voltage based on the extracted data change using the mapping relation 531 and the mapping relation 532.

As an example, it is assumed that the LSB read by the reading unit 120 from the identified multi-bit cell corresponds to "0", and "0" corresponds to the error bit detected by the error detection unit 130. When the MSB read by the reading unit 120 from the identified multi-bit cell corresponds to "0", the threshold voltage estimation unit 140 may estimate that the threshold voltage of the identified multi-bit cell is higher than the third read voltage level 523 when programming the data, and is lower than the third read voltage level 523 when reading the data.

Figure 6:
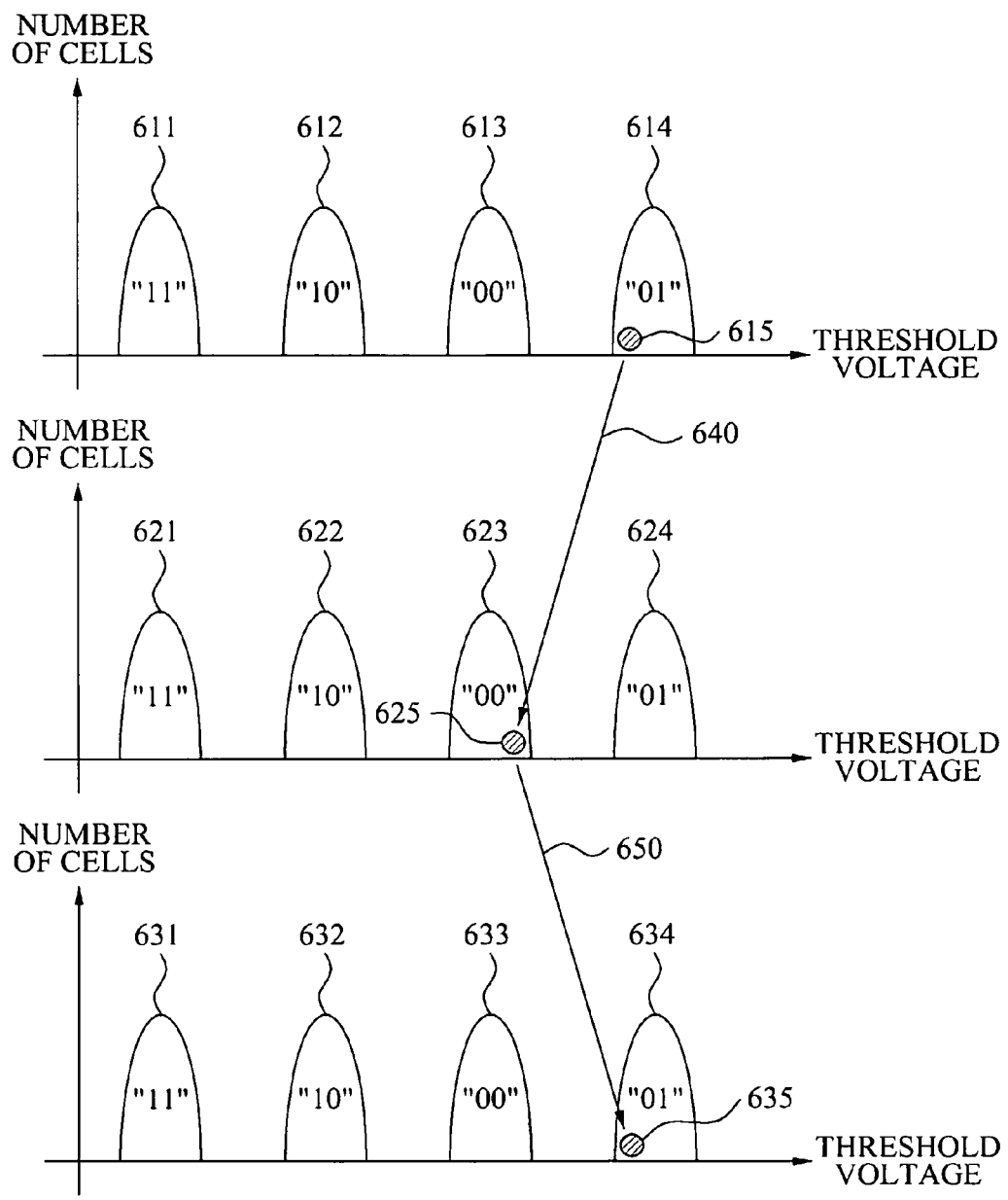
FIG. 6 illustrates another operation of the memory device of FIG. 1.

FIG. 6 illustrates another operation of the memory device 100 of FIG. 1.

Referring to FIG. 6, a relation between a threshold voltage and 2-bit data stored by multi-bit cells of the memory page 111 is illustrated.

A distribution of threshold voltages of the multi-bit cells is shown as a number of the multi-bit cells corresponding to the threshold voltage.

In the example illustrated in FIG. 6, a distribution 611 denotes the multi-bit cells storing data "11"; a distribution 612 denotes the multi-bit cells storing data "10"; a distribution 613 denotes the multi-bit cells storing data "00"; and a distribution 614 denotes the multi-bit cells storing data "01".

A state 615 denotes that the threshold voltage of the identified multi-bit cell is included in the distribution 614 when programming data. The data programmed in the identified multi-bit cell corresponds to "01".

An arrow 640 denotes a change of the threshold voltage of the identified multi-bit cell over time.

A distribution 621 denotes the multi-bit cells storing data "11"; a distribution 622 denotes the multi-bit cells storing data "10"; a distribution 623 denotes the multi-bit cells storing data "00"; a distribution 624 denotes the multi-bit cells storing data "01"; and a state 625 denotes that the threshold voltage of the identified multi-bit cell is included in the distribution 623 when reading the data. The data read from the identified multi-bit cell corresponds to "00".

The control unit 150 may perform a program operation in the identified multi-bit cell to increase the threshold voltage of the identified multi-bit cell. An arrow 650 denotes a rise of the threshold voltage of the identified multi-bit cell due to the program operation.

A distribution 631 denotes the multi-bit cells storing data "11"; a distribution 632 denotes the multi-bit cells storing data "10"; a distribution 633 denotes the multi-bit cells storing data "00"; and a distribution 634 denotes the multi-bit cells storing data "01".

A state 635 denotes the threshold voltage of the identified multi-bit cell restored by the program operation. The data stored in the identified multi-bit cell corresponds to "01".

The memory device 100 may determine whether a selective restoration operation with respect to the multi-bit cell storing an error bit is performed or whether the data is newly programmed in multi-bit cells of a new memory page, based on a rate of the error bit from among the data stored in the multi-bit cells of the memory page 111. The memory device 100 may newly program the data in the multi-bit cells of the new memory page when the rate of the error bit is greater than or equal to a reference value, and may perform the selective restoration operation with respect to the multi-bit cell storing the error bit when the rate of the error bit is less than the reference value.

The memory device 100 may newly program the data in the multi-bit cells of the new memory page when the change of the threshold voltage of the identified multi-bit cell is greater than or equal to the reference value, and may perform the selective restoration operation with respect to the multi-bit cell storing the error bit when the change of the threshold voltage is less than the reference value.

Example embodiments of FIGS. 5 and 6 denote a case where the multi-bit cell stores 2-bit data, however, example embodiments may be applied to a case where the multi-bit cell stores m-bit data (m>2).

Figure 7:
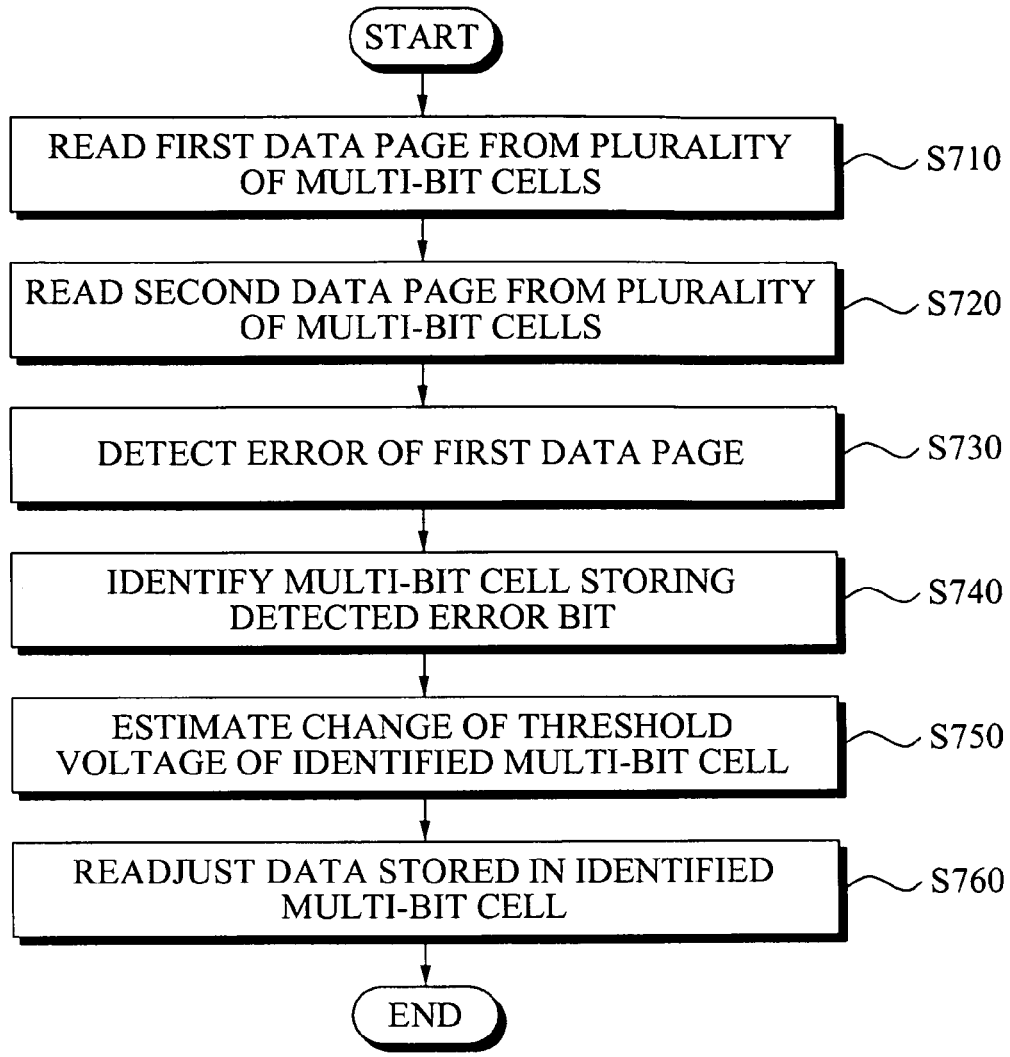
FIG. 7 is a flowchart illustrating a method of managing a memory data error according to example embodiments.

FIG. 7 is a flowchart illustrating a method of managing a memory data error according to example embodiments.

Referring to FIG. 7, in operation S710, the method of managing the memory data error may include reading a first data page from a plurality of multi-bit cells.

In operation S720, the method of managing the memory data error may include reading a second data page from the plurality of multi-bit cells. Though operation S720 is illustrated as taking place before operations S710, according to example embodiments, operation S720 may also be performed before operation S710.

In operation S730, the method of managing the memory data error may include detecting an error bit of the first data page.

In operation S740, the method of managing the memory data error may include identifying a multi-bit cell storing the detected error bit from among the plurality of multi-bit cells.

In operation S750, the method of managing the memory data error may include estimating a change of a threshold voltage of the identified multi-bit cell based on the detected error bit and the second data page.

In operation S760, the method of managing the memory data error may include readjusting data stored in the identified multi-bit cell based on the estimated change of the threshold voltage.

According to example embodiments, in operation S730, the method of managing the memory data error may perform ECC decoding of the first data page, and may detect the error bit of the first data page using an ECC decoding result.

According to example embodiments, in operation S760, the method of managing the memory data error may include adjusting the threshold voltage of the identified multi-bit cell based on the estimated change of the threshold voltage.

According to example embodiments, in operation S760, the method of managing the memory data error may include selecting any one of a first method and a second method based on the estimated change of the threshold voltage. The first method may correspond to a method of adjusting the threshold voltage of the identified multi-bit cell, and the second method may correspond to a method of programming the data stored in the identified multi-bit cell in new multi-bit cells.

Depending on embodiments, in operation S760, the method of managing the memory data error may include selecting any one of the first method and the second method based on a number of the detected error bits.

Figure 8:
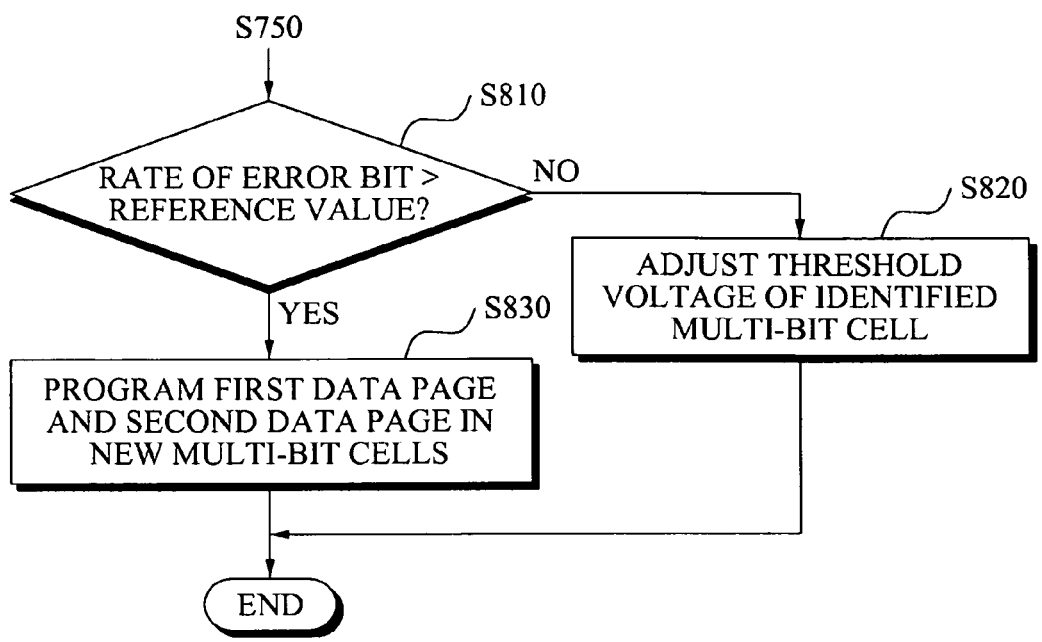
FIG. 8 is a flowchart illustrating readjustment of data stored in an identified multi-bit cell of FIG. 7.

FIG. 8 is a flowchart illustrating operation S760 of FIG. 7 in detail.

Referring to FIG. 8, in operation S810, the method of managing the memory data error may include deciding whether a rate of the detected error bit is greater than a reference value.

In operation S830, when the rate of the detected error bit is greater than the reference value, the method of managing the memory data error may include programming a first data page and a second data page in new multi-bit cells.

In operation S820, when the rate of the detected error bit is less than or equal to the reference value, the method of managing the memory data error may include adjusting a threshold voltage of the identified multi-bit cell.

Figure 9:
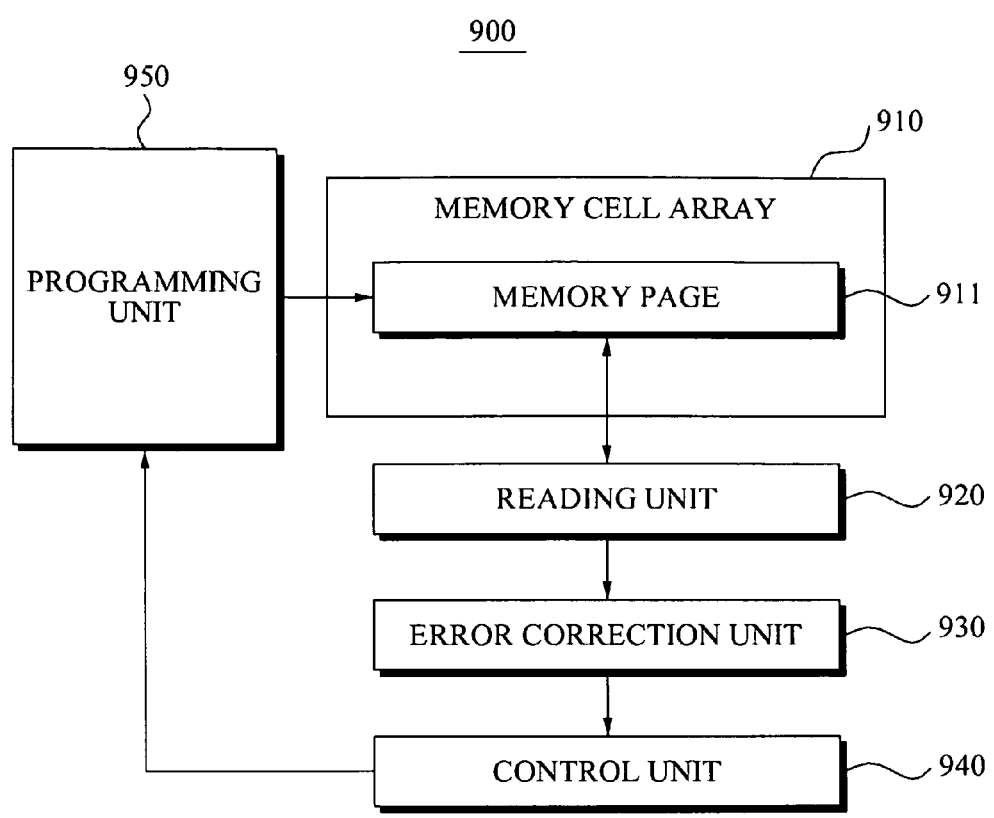
FIG. 9 is a block diagram illustrating another memory device according to example embodiments.

FIG. 9 is a block diagram illustrating another memory device 900 according to example embodiments.

Referring to FIG. 9, the memory device 900 may include a memory cell array 910, a reading unit 920, an error correction unit 930, a control unit 940, and a programming unit 950.

The memory cell array 910 may include a plurality of memory cells. A set of simultaneously-programmed memory cells may correspond to a memory page 911.

The reading unit 920 may read data from the plurality of memory cells included in the memory page 911.

The error correction unit 930 may detect an error bit of the read data. The error correction unit 930 may identify a memory cell storing the detected error bit from among the plurality of memory cells included in the memory page 911. The error correction unit 930 may correct the detected error bit.

The error correction unit 930 may perform ECC decoding of the read data to detect the error bit of the read data, and may correct the detected error bit. The ECC decoder 310 and the cell identification unit 320 of FIG. 3 may be applied to example embodiments of the error correction unit 930.

The control unit 940 may assign a verification voltage corresponding to the corrected bit to the identified memory cell, and may assign the verification voltage corresponding to the read data to remaining memory cells other than the identified memory cell from among the plurality of memory cells included in the memory page 911.

The programming unit 950 may readjust the data stored in the plurality of memory cells included in the memory page 911 using the assigned verification voltage. The programming unit 950 may increase a threshold voltage of each of the plurality of memory cells included in the memory page 911 until the threshold voltage of each of the plurality of memory cells included in the memory page 911 is higher than or equal to the assigned verification voltage. The programming unit 950 may inhibit programming with respect to the memory cell having the threshold voltage higher than or equal to the assigned verification voltage from among the plurality of memory cells included in the memory page 911.

The programming unit 950 may perform any one of a first method of readjusting the threshold voltage of the plurality of memory cells included in the memory page 911 and a second method of programming the data stored in the plurality of memory cells in memory cells included in a new memory page, the plurality of memory cells being included in the memory page 911, using the assigned verification voltage.

The control unit 940 may select any one of the first method and the second method based on a number of the detected error bits, and may control the programming unit 950 to enable the programming unit 950 to perform the selected method.

When the second method is selected, the programming unit 950 may adjust a rate of a message and redundant information to generate program data, and may program the generated program data in the memory cells included in the new memory page. The programming unit 950 may increase the rate of the redundant information, thereby increasing error correcting capability of the program data.

An ECC encoder may perform ECC encoding of the message and the redundant information to generate a codeword. The programming unit 950 may program the generated codeword in the memory cells included in the new memory page. The reading unit 920 may read the codeword from the memory cells included in the memory page 911 or the new memory page. An ECC decoder of the error correction unit 930 may perform ECC decoding of the codeword to restore the message.

The error correction unit 930 may compare a number of error bits detected from the read codeword or symbols with a first reference value and a second reference value. The first reference value and the second reference value may be less than the error correcting capability of the ECC decoder, and the first reference value may be less than the second reference value.

When the number of the detected error bits or the symbols is less than or equal to the first reference value, the control unit 940 may select the first method. When the number of the detected error bits or the symbols is greater than the first reference value and is less than or equal to the second reference value, the control unit 940 may select the second method.

The error correction unit 930 may calculate a BER of the read codeword. The control unit 940 may select any one of the first method and the second method based on the calculated BER. For example, the control unit 940 may select the first method when the BER is less than or equal to the first reference value, and may select the second method when the BER is greater than the first reference value and is less than or equal to the second reference value.

According to example embodiments, the memory cell array 910 may include a pilot cell. The pilot cell may not store data, and the memory device 900 may perform a sample function for estimating a change of the threshold voltage.

The control unit 940 may estimate the change of the threshold voltage using the pilot cell. The control unit 940 may select any one of the first method and the second method based on the estimated change of the threshold voltage. The control unit 940 may analyze a distortion degree of a distribution due to charge loss and the like using the pilot cell.

The control unit 940 may store time information about programming of the data in some memory cells of the plurality of memory cells of the memory page 911. The time information may be stored by a single-bit programming method. An ECC encoding scheme of increasing a rate of a redundant bit may be used for storing the time information.

The control unit 940 may compare current time information and the stored time information to select the first method when a difference between the current time information and the stored time information is less than or equal to the reference value. The control unit 940 may select the second method when the difference between the current time information and the stored time information is greater than the reference value.

When a number of times of the performing of the first method is greater than or equal to the reference value, the control unit 940 may select the second method.

The reading unit 920 may read the data from the plurality of memory cells in the memory cell array 910 for each time period. The memory device 900 may read the data stored in the plurality of memory cells in the memory cell array 910 for each time period, and may manage the error of the stored data. The control unit 940 may determine the length of the time periods based on a number of erases of the plurality of memory cells in the memory cell array 910. A number of programming and erases of the plurality of memory cells ay be referred to as a P/E cycle, and the memory cells having a great P/E cycle may be estimated to have a great change of the threshold voltage due to charge loss. For example, as the P/E cycle increases, the control unit 940 may set a short time period.

According to example embodiments, the plurality of memory cells in the memory cell array 910 may correspond to multi-bit cells storing multi-bit data. The reading unit 920 may read a plurality of data pages from the plurality of memory cells included in the memory page 911. The error correction unit 930 may detect the error bit of the read plurality of data pages, and may correct the detected error bit. The error correction unit 930 may substitute the detected error bit with the corrected bit to restore the plurality of data pages. The control unit 940 may determine the verification voltage to be assigned to the identified multi-bit cell based on the restored plurality of data pages.

FIG. 1 illustrates an operation of the memory device 900 of FIG. 9.

Figure 11:
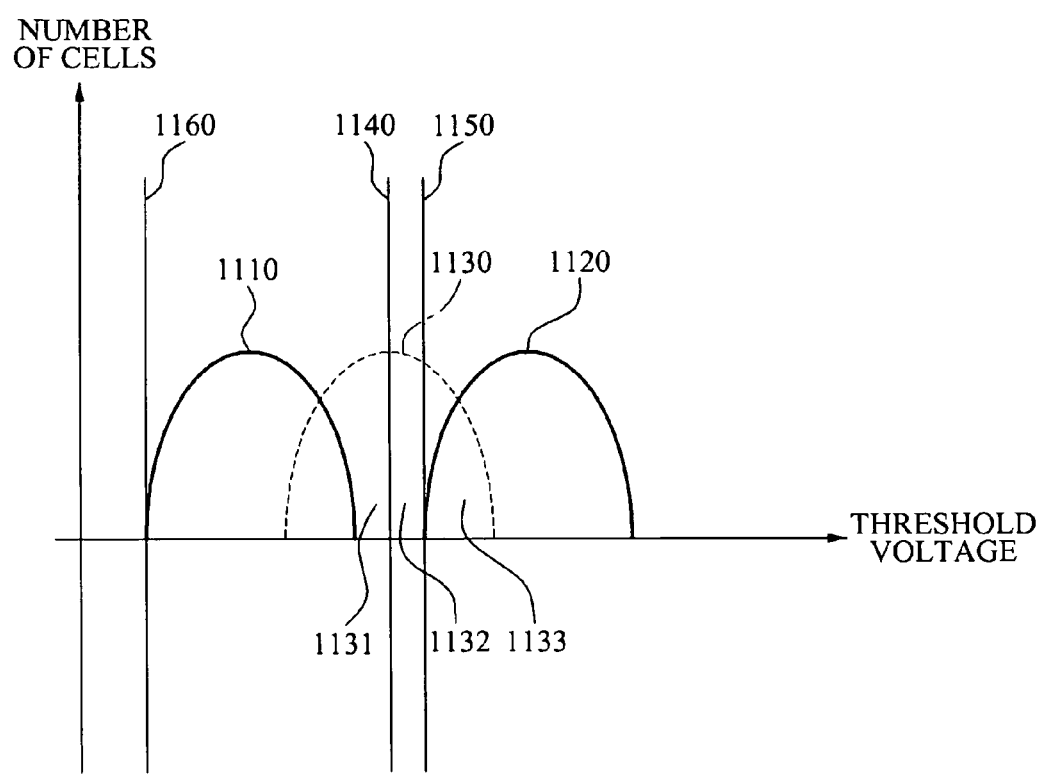
FIG. 11 illustrates an operation of the memory device of FIG. 9.

Referring to FIG. 11, a number of memory cells corresponding to threshold voltage levels is shown.

Threshold voltages of a memory cell storing data A may generate a distribution 1110.

Threshold voltages of a memory cell storing data B may generate a distribution 1120. The programming unit 950 may select a voltage level 1150 as a verification voltage, and may program data B using the selected verification voltage.

When time passes after data B is stored, the threshold voltage of the memory cell may decrease due to charge loss. After time passes, the threshold voltages of the memory cell storing data B may generate a distribution 1130.

The reading unit 920 may select a voltage level 1140 as a read voltage (or a reference voltage). The reading unit 920 may read the data stored in the memory cells using the selected read voltage. The reading unit 920 may decide, as B, the data stored in the memory cells having the threshold voltage higher than the voltage level 1140, and may decide, as A, the data stored in the memory cells having the threshold voltage lower than the voltage level 1140.

Since threshold voltages of the memory cell storing data B may generate the distribution 1130 over time, the reading unit 920 may decide, as A, the data stored in the memory cells corresponding to a distribution portion 1131 from among the memory cells corresponding to the distribution 1130. The distribution portion 1131 corresponds to a distribution portion generated by the memory cells having the threshold voltage lower than the voltage level 1140 from among the memory cells corresponding to the distribution 1130.

The error correction unit 930 may perform ECC decoding to detect an error of the data stored in the memory cells corresponding to the distribution portion 1131. The error correction unit 930 may identify the memory cell storing the detected error, and may thereby identify the memory cells corresponding to the distribution portion 1131.

The control unit 940 may select the voltage level 1150 as the verification voltage of the identified memory cells (the memory cells corresponding to the distribution portion 1131). The control unit 940 may select a voltage level 1160 as the verification voltage of the memory cells corresponding to the distribution 1110. The control unit 940 may select the verification voltage of the memory cells corresponding to the distribution portion 1131 based on an error correction result due to the ECC decoding instead of a decision result due to the voltage level 1140.

The control unit 940 may select the voltage level 1150 as the verification voltage of the memory cells corresponding to a distribution portion 1132 and a distribution portion 1133. The control unit 940 may select the verification voltage of the memory cells corresponding to the distribution portion 1132 and the distribution portion 1133 based on the decision result due to the voltage level 1140.

The programming unit 950 may readjust the threshold voltage of each of the memory cells using the assigned verification voltage. The programming unit 950 may readjust the threshold voltage of the memory cells corresponding to the distribution 1110 using the voltage level 1160 assigned as the verification voltage to the memory cells corresponding to the distribution 1110. Since the threshold voltage of the memory cells corresponding to the distribution 1110 may be higher than the voltage level 1160, the programming unit 950 may inhibit programming with respect to the memory cells corresponding to the distribution 1110.

The programming unit 950 may readjust the threshold voltage of the memory cells corresponding to the distribution 1130 using the voltage level 1150 assigned as the verification voltage to the memory cells corresponding to the distribution 1130. The programming unit 950 may increase the threshold voltage of the memory cells corresponding to the distribution portion 1131 and the distribution portion 1132 until the threshold voltage of the memory cells corresponding to the distribution portion 1131 and the distribution portion 1132 is higher than or equal to the voltage level 1150. Since the threshold voltage of the memory cells corresponding to the distribution portion 1133 may be higher than the voltage level 1150, the programming unit 950 may inhibit programming with respect to the memory cells corresponding to the distribution portion 1133.

The memory device 900 may perform a sequence of data readjustment with respect to the memory cells identified as storing the error (the memory cells corresponding to the distribution portion 1131) and the memory cells decided as storing data B. The memory device 900 may increase the threshold voltage of the memory cells having the threshold voltage which is higher than the voltage level 1140 corresponding to a read voltage and is lower than the voltage level 1150 corresponding to the verification voltage, that is, the memory cells corresponding to the distribution portion 1132 to be higher than or equal to the voltage level 1150.

The data stored in the memory cells corresponding to the distribution portion 1132 may be decided without the error due to the voltage level 1140, however, data corruption may be developing due to charge loss and the like. The memory device 900 may readjust the data stored in the memory cells corresponding to the distribution portion 1132, thereby reducing the ongoing data corruption.

According to example embodiments, the memory device 900 may set a voltage level different from the voltage level 1150 as the verification voltage to the memory cells corresponding to the distribution portion 1131. For example, since a data corruption possibility of the memory cells corresponding to the distribution portion 1131 may be strong, the memory device 900 may set the voltage level higher than the voltage level 1150 as the verification voltage.

The memory device 900 may transmit data to an external host in response to an access request for the memory device 900 from the external host. The memory device 900 may readjust the data before the data is transmitted to the external host. The memory device 900 may transmit the readjusted data to the external host, thereby reducing the error included in the data transmitted to the external host.

The memory device 900 may readjust the data stored in the memory cell array 910 in an idle state where the access request for the memory device 900 from the external host does not exist. The memory device 900 may readjust the data stored in the memory cell array 910 during the idle state, thereby reducing the error included in the data stored in the memory cell array 910.

Figure 10:
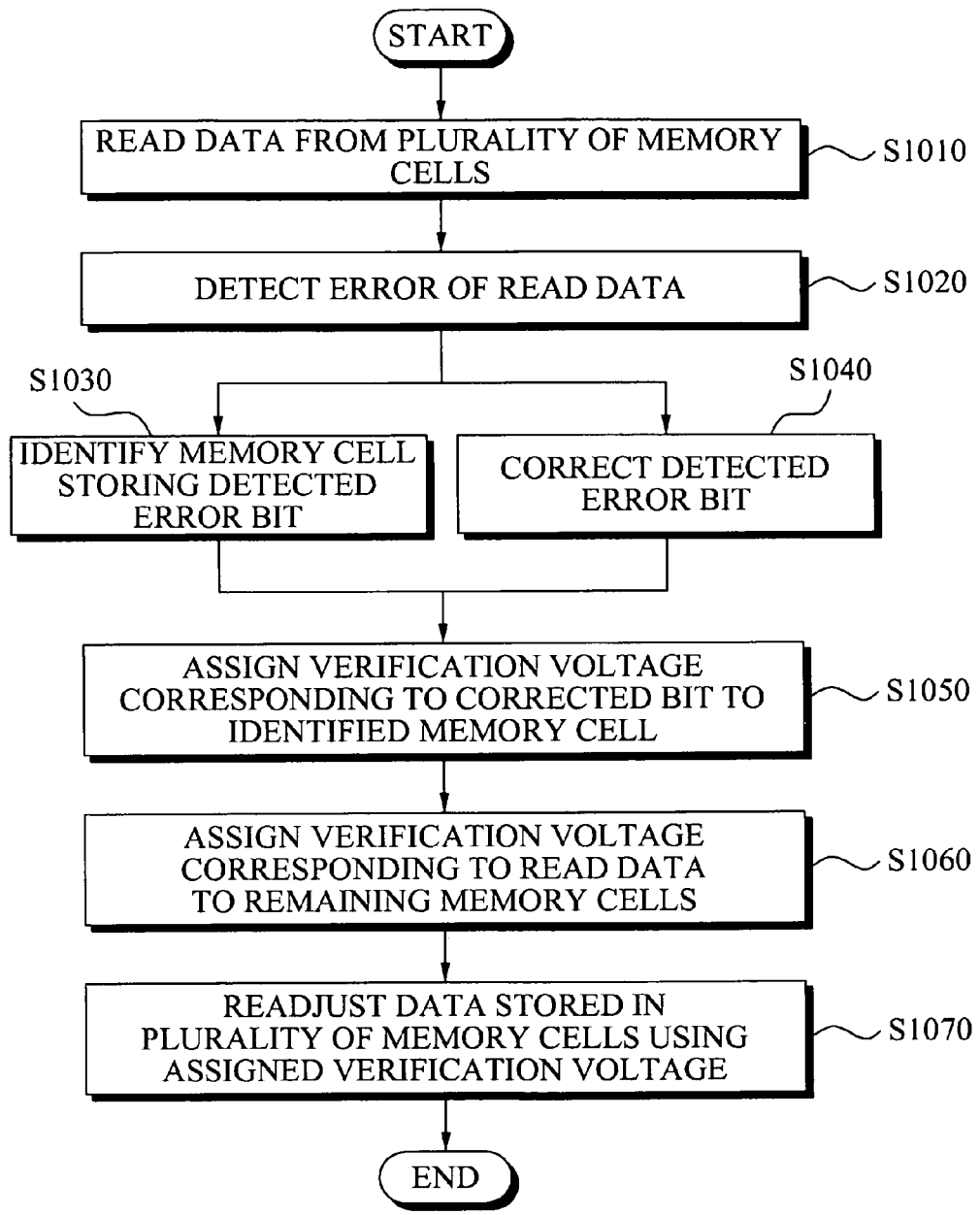
FIG. 10 is a flowchart illustrating another method of managing a memory data error according to example embodiments.

FIG. 10 is a flowchart illustrating another method of managing a memory data error according to example embodiments.

Referring to FIG. 10, in operation S1010, the method of managing the memory data error may include reading data from a plurality of memory cells.

In operation S1020, the method of managing the memory data error may include detecting an error bit of the read data.

In operation S1030, the method of managing the memory data error may include identifying a memory cell storing the detected error bit from among the plurality of memory cells.

In operation S1040, the method of managing the memory data error may include correcting the detected error bit.

In operation S1050, the method of managing the memory data error may include assigning a verification voltage corresponding to the corrected bit to the identified memory cell.

In operation S1060, the method of managing the memory data error may include assigning the verification voltage corresponding to the read data to remaining memory cells other than the identified memory cell from among the plurality of memory cells In operation S1070, the method of managing the memory data error may include readjusting the data stored in the plurality of memory cells using the assigned verification voltage.

The method of managing the memory data error according to example embodiments may be applied to various memory devices including a flash memory, a Dynamic Random Access Memory (DRAM), a Phase Change Random Access Memory (PRAM), a Magnetic Random Access Memory (MRAM), and the like.

The method of managing the memory data error according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. For example, the memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
    a memory cell array including a plurality of first memory cells;
    a reading unit configured to read data from the plurality of first memory cells;
    an error correction unit configured to,
        detect an error bit of the read data,
        identify a memory cell storing the detected error bit from among the plurality of first memory cells, and
        correct the detected error bit;
    a control unit configured to assign a verification voltage to each of the plurality of first memory cells, the assigned verification voltage corresponding to the corrected bit for the identified memory cell, the assigned verification voltage corresponding to the read data for the remaining memory cells other than the identified memory cell from among the plurality of first memory cells; and
    a programming unit configured to,
        readjust, using the assigned verification voltage, the data stored in the plurality of first memory cells by changing one or more threshold voltages from among threshold voltages of the plurality of first memory cells, and
        upon the changing of the one or more threshold voltages, apply a condition voltage to one or more of the plurality of first memory cells having threshold voltages equal to or greater than the assigned verification voltage, to inhibit a change of the threshold voltages of the one or more of the plurality of first memory cells.

2. The memory device of claim 1, wherein
    each of the plurality of first memory cells corresponds to a multi-bit cell storing multi-bit data,
    the reading unit reads a plurality of data pages from the plurality of first memory cells,
    the error correction unit detects the error bit in the read plurality of data pages, and corrects the detected error bit, and
    the control unit determines the verification voltage corresponding to the corrected bit based on the corrected bit and the plurality of data pages.

3. The memory device of claim 1, wherein the programming unit changes the one or more threshold voltages by increasing a threshold voltage of each of the plurality of first memory cells until the threshold voltage of each of the plurality of first memory cells is equal to or higher than the assigned verification voltage.

4. The memory device of claim 1, wherein the error correction unit includes,
    an error control codes (ECC) decoder configured to,
        decode the read data to detect the error bit of the read data, and
        correct the detected error bit, and
    a cell identification unit configured to identify the memory cell storing the detected error bit from among the plurality of first memory cells.

5. The memory device of claim 1, wherein the control unit is further configured to,
    select, based on a number of the detected error bits, any one of a first method of changing at least one of the one or more threshold voltages and a second method of programming the data stored in the plurality of first memory cells in new memory cells, and
    control the programming unit to enable the programming unit to perform any one of the selected first method and the selected second method.

6. The memory device of claim 5, wherein, when the second method is selected, the programming unit is configured to,
    adjust a rate of a message and redundancy to generate program data, and
    program the generated program data in the new memory cells.

7. The memory device of claim 1, wherein the control unit is configured to,
    estimate a change of at least one of the one or more threshold voltages using a pilot cell in the memory cell array,
    select, based on the estimated change of the at least one of the one or more threshold voltages, any one of a first method of changing the at least one of the one or more threshold voltages and a second method of programming the data stored in the plurality of first memory cells in new memory cells, and
    control the programming unit to enable the programming unit to perform any one of the selected first method and the selected second method.

8. The memory device of claim 1, wherein the control unit is further configured to,
    store time information about programming of the data in the plurality of first memory cells,
    select, based on the stored time information, any one of a first method of changing at least one of the one or more threshold voltages and a second method of programming the data stored in the plurality of first memory cells in new memory cells, and control the programming unit to enable the programming unit to perform any one of the selected first method and the selected second method.

9. The memory device of claim 1, wherein the control unit is further configured to control the programming unit to enable the programming unit to perform a first method of changing at least one of the one or more threshold voltages, and when a number of times of the performing of the first method is greater than a reference value, the control unit controls the programming unit to enable the programming unit to perform a second method of programming the data stored in the plurality of first memory cells in new memory cells.

10. The memory device of claim 1, wherein the control unit is further configured to, select, based on a number of erases of the plurality of first memory cells, any one of a first method of changing at least one of the one or more threshold voltages and a second method of programming the data stored in the plurality of first memory cells in new memory cells, and control the programming unit to enable the programming unit to perform any one of the selected first method and the selected second method.

11. The memory device of claim 1, wherein the reading unit is configured to read the data from the plurality of memory cells within each of a plurality of time periods.

12. The memory device of claim 11, wherein the reading unit is configured to determine a length of each of the plurality of time periods based on a number of erases of the plurality of memory cells.

13. The memory device of claim 1, wherein the control unit is configured to control the programming unit to readjust the data stored in the plurality of first memory cells based on at least one of a metric, a syndrome, and a bit error rate (BER) of the read data.

14. The memory device of claim 1, wherein the reading unit is configured to read the data from the plurality of first memory cells in response to an access request from a host for the data stored in the plurality of first memory cells.

15. The memory device of claim 1, wherein the reading unit is configured to read the data from the plurality of first memory cells during an idle state when an access request for the data stored in the plurality of first memory cells from a host does not exist.

16. The memory device of claim 1, wherein the control unit sets, as the verification voltage, a voltage level different from a previous verification voltage used when the data was stored in the plurality of first memory cells.

17. A method of managing a memory data error, the method comprising:

reading data from a plurality of first memory cells;
detecting an error bit of the read data;
identifying a memory cell storing the detected error bit from among the plurality of first memory cells;
correcting the detected error bit;
assigning a verification voltage to each of the plurality of first memory cells, the assigned verification voltage corresponding to the corrected bit for the identified memory cell, the assigned verification voltage corresponding to the read data for remaining memory cells other than the identified memory cell from among the plurality of first memory cells;

readjusting the data, using the assigned verification voltage, stored in the plurality of first memory cells by changing one or more threshold voltages from among threshold voltages of the plurality of first memory cells; and upon the changing of the one or more threshold voltages, applying a condition voltage to one or more of the plurality of first memory cells having threshold voltages equal to or greater than the assigned verification voltage, to inhibit a change of the threshold voltages of the one or more of the plurality of first memory cells.

18. The method of claim 17, wherein the readjusting comprises:

selecting, based on a number of the detected error bits, any one of a first method of changing at least one of the threshold voltages of the plurality of first memory cells and a second method of programming the data stored in the plurality of first memory cells in new memory cells;

increasing the threshold voltage of each of the plurality of first memory cells until the threshold voltage of each of the plurality of first memory cells is equal to or higher than a corresponding assigned verification voltage when the first method is selected; and increasing the threshold voltage of each of the new memory cells until the threshold voltage of each of the new memory cells is equal to or higher than the corresponding assigned verification voltage when the second method is selected.

19. The method of claim 17, wherein the readjusting comprises:

estimating a change of at least one of the one or more threshold voltages using a pilot cell in the memory cell array; and selecting, based on the estimated change of the at least one of the threshold voltages, any one of a first method of changing the at least one of the one or more threshold voltages and a second method of programming the data stored in the plurality of first memory cells in new memory cells.

20. The method of claim 17, wherein the readjusting comprises:

storing time information about programming of the data in the plurality of first memory cells; and selecting, based on the stored time information, any one of a first method of changing at least one of the one or more threshold voltages and a second method of programming the data stored in the plurality of memory cells in new memory cells.

21. The method of claim 17, wherein the readjusting comprises:

performing a first method of changing at least one of the one or more threshold voltages;

deciding whether a number of times of the performing of the first method is greater than a reference value; and performing a second method of programming the data stored in the plurality of first memory cells in new memory cells when the number of times of the performing of the first method is greater than the reference value.

22. A non-transitory computer-readable recording medium storing a program for implementing the method of claim 17.

* * * * *